(12) United States Patent
Wang et al.

(10) Patent No.: US 10,331,180 B1
(45) Date of Patent: Jun. 25, 2019

(54) SECURING APPARATUS AND ELECTRONIC DEVICE USING THE SAME

(71) Applicant: HONGFUJIN PRECISION ELECTRONICS (TIANJIN) CO., LTD., Tianjin (CN)

(72) Inventors: Ya-Nan Wang, Tianjin (CN); Gong-Wen Zhang, Tianjin (CN); Han-Yu Li, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 15/891,206

(22) Filed: Feb. 7, 2018

(30) Foreign Application Priority Data

Dec. 25, 2017 (CN) .......................... 2017 1 1427412

(51) Int. Cl.
*H05K 7/00* (2006.01)
*G06F 1/18* (2006.01)
*H05K 7/14* (2006.01)

(52) U.S. Cl.
CPC .............. *G06F 1/184* (2013.01); *G06F 1/185* (2013.01); *H05K 7/1405* (2013.01)

(58) Field of Classification Search
None
See application file for complete search history.

(56) References Cited

U.S. PATENT DOCUMENTS

| | | | | |
|---|---|---|---|---|
| 4,758,928 A * | 7/1988 | Wierec | ................. | H01R 13/645 211/41.17 |
| 5,191,970 A * | 3/1993 | Brockway | ............ | H05K 7/1414 200/292 |
| 5,203,714 A * | 4/1993 | Tuan | ..................... | H01R 12/716 439/326 |
| 5,343,009 A * | 8/1994 | Araoka | .................... | H01H 9/20 200/322 |
| 5,989,043 A * | 11/1999 | Han | ...................... | H05K 7/1414 439/157 |
| 5,997,326 A * | 12/1999 | Koradia | ........... | H01R 13/62933 439/160 |
| 6,388,884 B1 * | 5/2002 | Greco | ...................... | H01H 9/20 200/50.02 |
| 6,490,153 B1 * | 12/2002 | Casebolt | ................. | G06F 1/184 361/679.33 |
| 6,693,802 B2 * | 2/2004 | Vier | ...................... | H05K 7/1429 361/752 |
| 6,992,900 B1 * | 1/2006 | Suzue | .................. | H05K 7/1409 361/726 |
| 7,070,431 B1 * | 7/2006 | White | ..................... | G06F 1/184 361/754 |
| 7,172,441 B2 * | 2/2007 | Schlack | ............... | H01R 13/633 439/152 |

(Continued)

*Primary Examiner* — Courtney L Smith
*Assistant Examiner* — Rashen E Morrison
(74) *Attorney, Agent, or Firm* — ScienBiziP, P.C.

(57) ABSTRACT

A securing apparatus for mounting a PCI or memory card comprises a mounting member and a base. The mounting member comprises a first fastening portion and a second fastening portion. The first fastening portion is connected to the second fastening portion through a fulcrum. The securing apparatus secures the memory card on an electronic device without the need for screws or other means of fixing.

8 Claims, 5 Drawing Sheets

(56) References Cited

U.S. PATENT DOCUMENTS

| | | | | |
|---|---|---|---|---|
| 7,292,456 | B2* | 11/2007 | Leung | H05K 7/1409 |
| | | | | 361/747 |
| 7,483,268 | B1* | 1/2009 | King, Jr. | G06F 1/187 |
| | | | | 248/682 |
| 8,310,834 | B2* | 11/2012 | Furholzer | H02B 1/052 |
| | | | | 361/747 |
| 2010/0187957 | A1* | 7/2010 | Liang | G06F 1/187 |
| | | | | 312/223.2 |
| 2016/0295736 | A1* | 10/2016 | Mau | G06F 1/18 |

* cited by examiner

SECURING APPARATUS AND ELECTRONIC DEVICE USING THE SAME

FIELD

The subject matter herein generally relates securing apparatus and electronic device using the same.

BACKGROUND

In general, a Peripheral Component Interconnect (PCI) card can be inserted into the bracket and secured to the bracket with screws. Having to use screws is not convenient.

BRIEF DESCRIPTION OF THE DRAWINGS

Implementations of the present technology will now be described, by way of example only, with reference to the attached figures.

DETAILED DESCRIPTION

Figure 1:
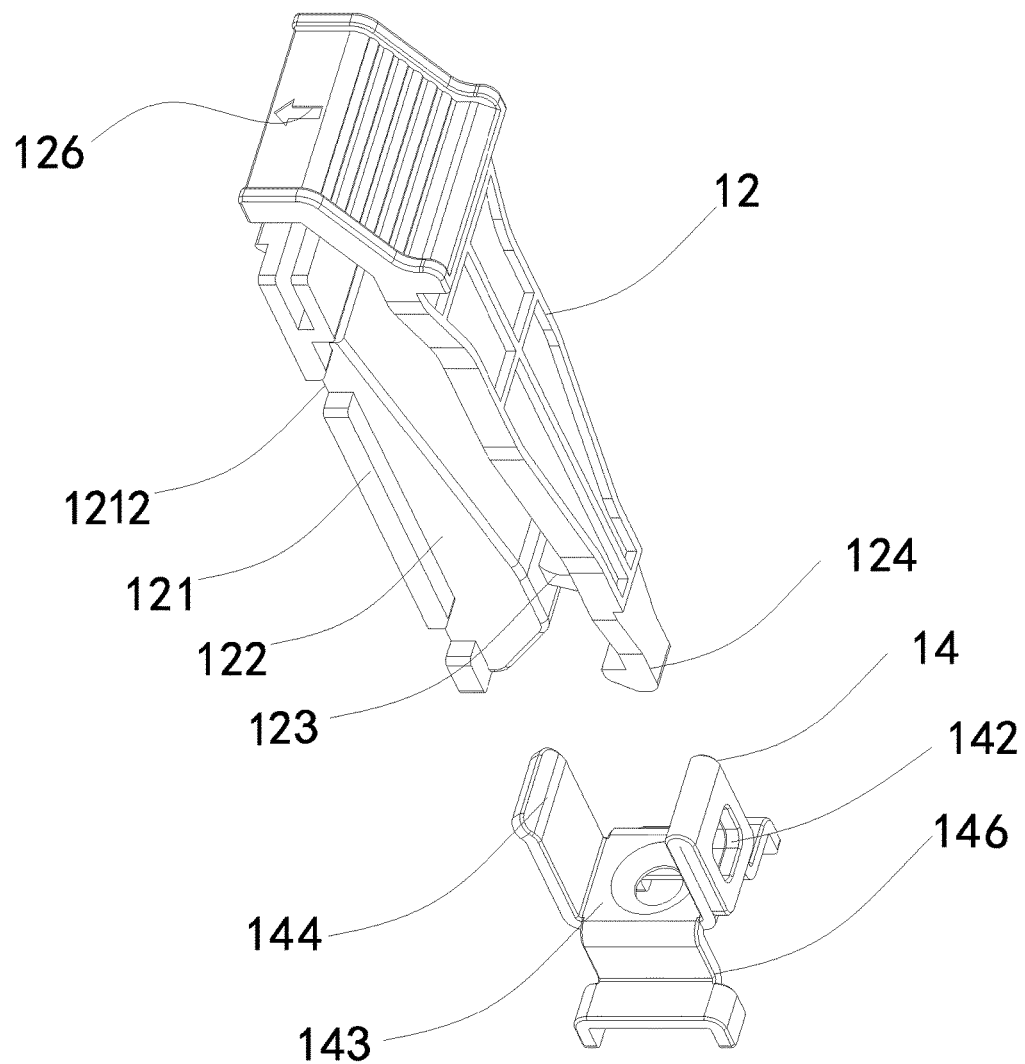
FIG. 1 is an exploded view of an exemplary embodiment of a securing apparatus which is not assembled.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
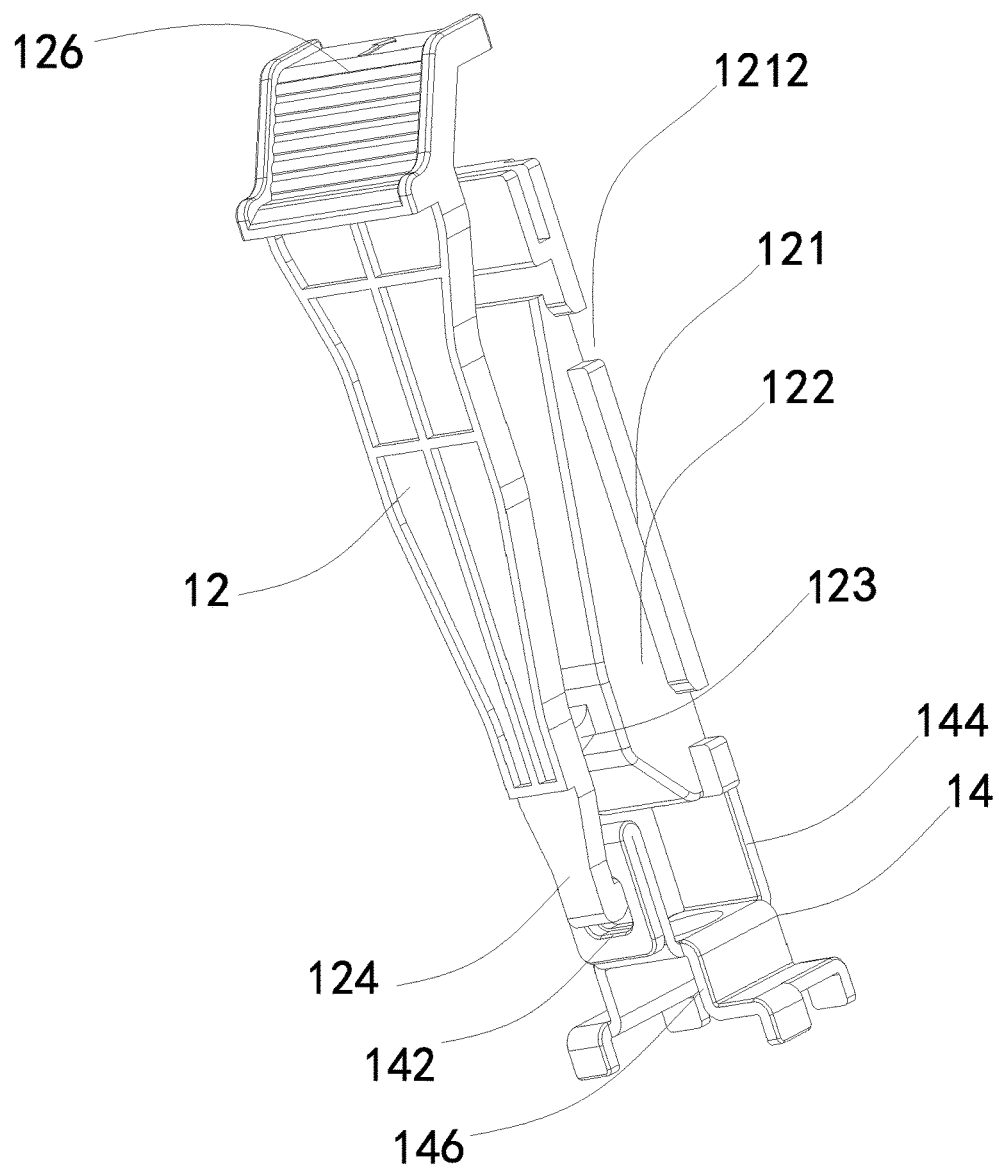
FIG. 2 is an isometric view of the securing apparatus of FIG. 1 connected to a chassis.

FIG. 1 and FIG. 2 illustrate a securing apparatus 10 in an exemplary embodiment. The securing apparatus 10 is configured to secure a memory card 22 (shown in FIG. 4) on an electronic device 20 (also shown in FIG. 4).

The securing apparatus 10 comprises a mounting member 12 and a base 14. The mounting member 12 comprises a first fastening portion 122 and a second fastening portion 124, the first fastening portion 122 is connected to the second fastening portion 124 through a fulcrum 123.

The mounting member 12 has a double-layered structure. An upper layer is the second fastening portion 124, and a lower layer is the first fastening portion 122.

The second fastening portion 124 comprises a hook 125 and a pressing portion 126. The pressing portion 126 and the hook 125 are located at sides of the fulcrum 123.

The base 14 defines a first through hole 142 that matches the hook 125. The hook 125 can be inserted into the first through hole 142, and the mounting member 12 is thus connected to base 14. The pressing portion 126 is pressed with the fulcrum 123 as a supporting point, and the hook 125 is thereby detached from the first through hole 142. When the mounting member 12 is pulled upwardly, the mounting member 12 is disconnected from the base 14.

In at least one exemplary embodiment, the mounting member 12 further comprises two fixing blocks 121. A fixing block 121 is located at each side of the first fastening portion 122. Each fixing block 121 defines a notch 1212.

In at least one exemplary embodiment, the base 14 comprises a main portion 143, two fixing pieces 144, and a mounting portion 146.

A top surface of the main portion 143 extends upwards to form two fixing pieces 144. A fixing piece 144 is arranged on opposite sides of the main portion 143. One of two fixing pieces 144 defines the first through hole 142.

A bottom surface of the main portion 143 also extends downwards to form the mounting portion 146. In at least one exemplary embodiment, the mounting portion 146 is formed by four legs. The mounting portion 146 has a supporting function.

In at least one exemplary embodiment, the mounting member 12 is made of plastic material, to reduce the manufacturing cost of the securing apparatus 10.

Figure 3:
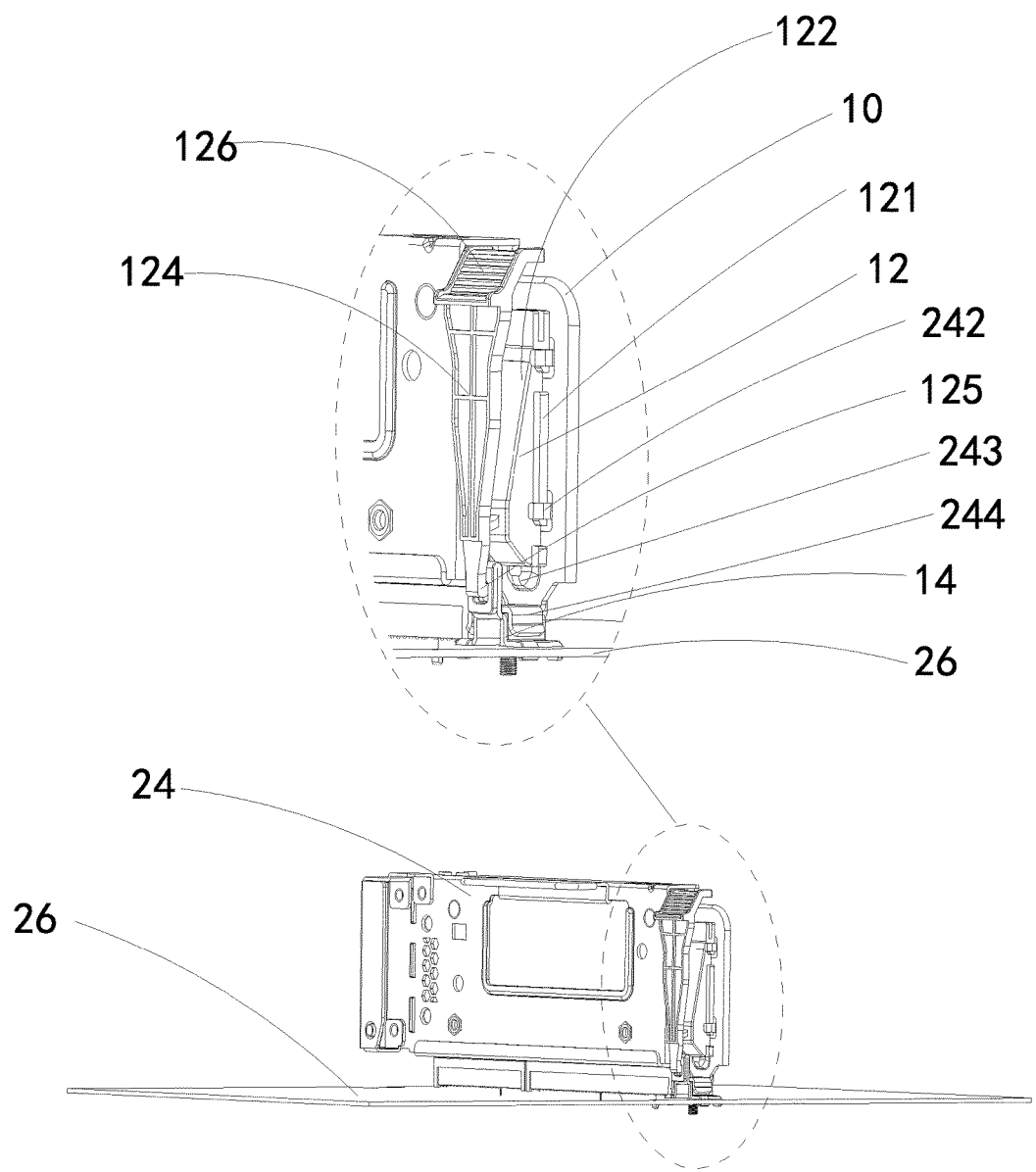
FIG. 3 is an isometric view and partial enlarged view of an exemplary embodiment of an electronic device.
Figure 4:
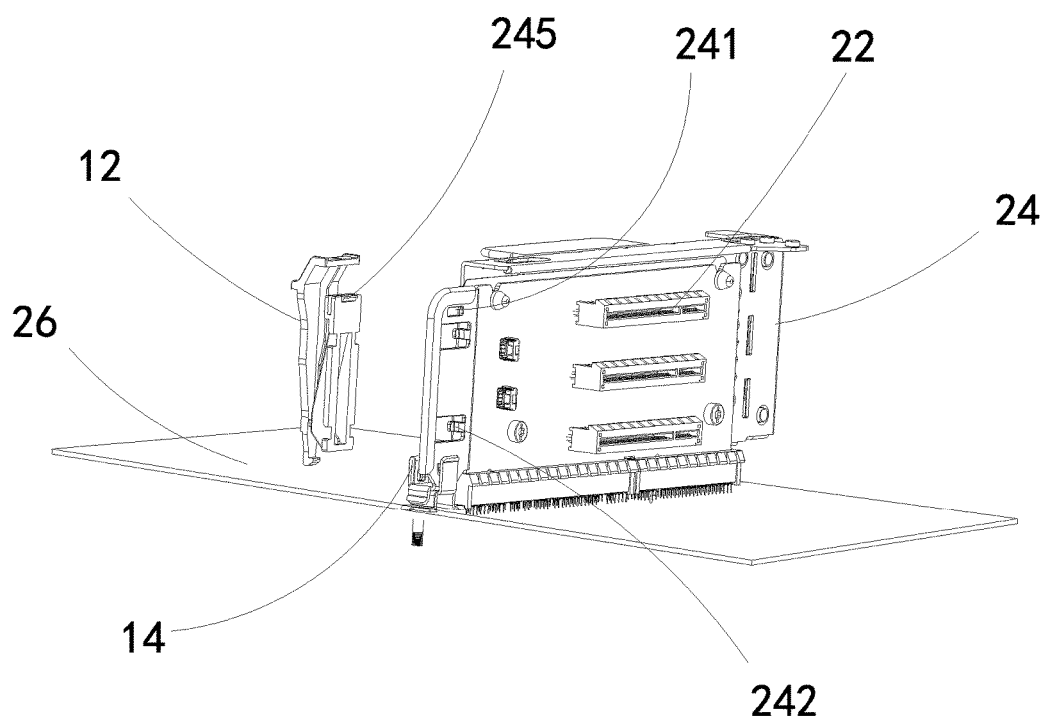
FIGS. 4 and 5 are isometric views of the electronic device of FIG. 3.
Figure 5:
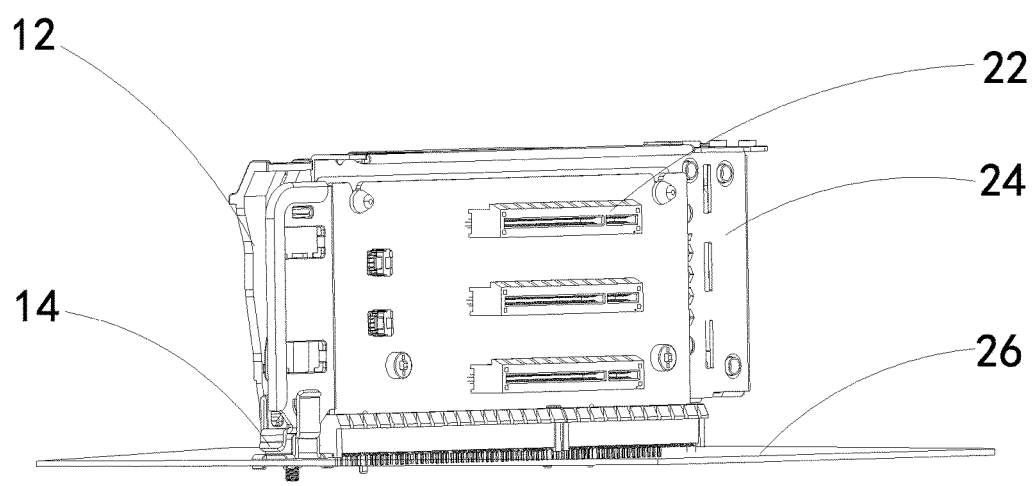

Referring to FIGS. 3-5, the securing apparatus 10 may be used in the electronic device 20 to secure the memory card 22. The securing apparatus 10 also further comprises a bracket 24 and a motherboard 26. The memory card 22 is fixed on the bracket 24, and the base 14 is fixed on the motherboard 26. The motherboard 26 defines a plurality of mounting holes, and the four legs of the mounting portion 146 pass through the mounting holes of the motherboard 26, the base 14 being thereby fixed on the motherboard 26.

In the exemplary embodiment, the bracket 24 comprises a protruding portion 242, and the protruding portion 242 matches with the notch 1212 of the fixing block 121. When the mounting member 12 is pushed vertically downwards, the protruding portion 242 of the bracket 24 engages with the fixing block 121 through the notch 1212.

In the exemplary embodiment, the first fastening portion 122 comprises a limiting portion 245. The bracket 24 defines a second through hole 241, and the limiting portion 245 matches with the second through hole 241. The second through hole 241 is located at a top of the bracket 24. The limiting portion 245 can be latched into the second through hole 241 to prevent the mounting member 12 from moving upwards.

The bracket 24 further comprises a protrusive block 243. The protrusive block 243 matches with the first fastening portion 122 to fix the mounting member 12 on the bracket 24. The protrusive block 243 is located at a bottom of the bracket 24 and configured to support the mounting member 12.

The protruding portion 242 is located at an intermediate position of the bracket 24. The protruding portion 242 can pass through the notch 1212 to engage with the fixing block 121, and the mounting member 12 is thereby fixed on the bracket 24.

In the exemplary embodiment, the bracket 24 further comprises a supporting portion 244, and the supporting portion 244 is located between two fixing pieces 144 of the mounting member 12.

The first fastening portion 122 is connected to the second fastening portion 124 through a fulcrum 123.

When the mounting member 12 is pushed downwards, the hook 125 can be inserted into the first through hole 142, and the bracket 24 is thereby connected to the base 14.

When the pressing portion 126 is pressed with the fulcrum 123 as a supporting point, the hook is detached from the first through hole 142, the mounting member 12 is pulled upwardly, and the bracket 24 is thus detached from the base 14.

The securing apparatus 10 thus secures the memory card 22 on the electronic device 20.

The exemplary embodiments shown and described above are only examples. Many details are often found in the art such as the other features of securing apparatus. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An electronic device comprising:
    a memory card; and
    a securing apparatus comprising:
        a bracket and a motherboard;
        a mounting member comprising a first fastening portion and a second fastening portion, the first fastening portion connecting to the second fastening portion through a fulcrum, the second fastening portion comprising a hook and a pressing portion, the pressing portion and the hook locating at sides of the fulcrum; and
        a base comprising a first through hole, the first through hole matching with the hook of the second fastening portion;
    wherein the mounting member is fixed on the bracket, the memory card is fixed on the bracket, and the base is fixed on the motherboard.

2. The electronic device of claim 1, wherein the mounting member further comprises two fixing blocks, a fixing block is located at each side of the first fastening portion, and each fixing block defines a notch; the bracket comprises a protruding portion, the protruding portion matches with the notch of the fixing block, and the protruding portion of the bracket is engaged with the fixing block through the notch.

3. The securing apparatus of claim 2, wherein the base comprises a main portion, two fixing pieces, and a mounting portion; a fixing piece is arranged on opposite sides of the main portion, and one of two fixing pieces defines the first through hole.

4. The electronic device of claim 3, wherein a top surface of the main portion extends upward to form two fixing pieces.

5. The electronic device of claim 4, wherein a bottom surface of the main portion extends downward to form the mounting portion.

6. The electronic device of claim 5, wherein the bracket further comprises a supporting portion, the supporting portion is located between two fixing pieces of the mounting member.

7. The electronic device of claim 6, wherein the first fastening portion comprises a limiting portion, the bracket defines a second through hole, and the limiting portion matches with the second through hole.

8. The electronic device of claim 7, wherein the bracket further comprises a protrusive block, the protrusive block matches with the first fastening portion to fix the mounting member on the bracket.

\* \* \* \* \*